US008906780B2

(12) United States Patent
Argoud et al.

(10) Patent No.: US 8,906,780 B2
(45) Date of Patent: Dec. 9, 2014

(54) METHOD FOR TRANSFERRING A THIN LAYER OF MONOCRYSTALLINE SILICON

(75) Inventors: Maxime Argoud, Lyons (FR); Hubert Moriceau, Saint Egreve (FR); Christian Fretigny, Paris (FR)

(73) Assignees: Commissariat a l'energie atomique et aux energies alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/805,796

(22) PCT Filed: Jun. 21, 2011

(86) PCT No.: PCT/EP2011/060380
§ 371 (c)(1),
(2), (4) Date: Dec. 20, 2012

(87) PCT Pub. No.: WO2011/161122
PCT Pub. Date: Dec. 29, 2011

(65) Prior Publication Data
US 2013/0092320 A1   Apr. 18, 2013

(30) Foreign Application Priority Data

Jun. 22, 2010   (FR) ...................................... 10 54969

(51) Int. Cl.
*H01L 21/30*   (2006.01)
*C23C 14/48*   (2006.01)
*C23C 14/00*   (2006.01)
*B32B 38/00*   (2006.01)
*H01L 21/762*  (2006.01)

(52) U.S. Cl.
CPC ............. *B32B 38/0008* (2013.01); *C23C 14/48* (2013.01); *C23C 14/0005* (2013.01); *H01L 21/76254* (2013.01)
USPC ........................................................ 438/458

(58) Field of Classification Search
CPC .............. H01L 27/04; H01L 21/76354; H01L 219/78564; H01L 29/16
USPC ............... 438/458, FOR. 106, 14, 151, 455, 438/164–168; 257/E21.568, E21.57, 506, 257/64
See application file for complete search history.

(56) References Cited

U.S. PATENT DOCUMENTS

| 5,744,852 | A * | 4/1998 | Linn et al. | ...................... 257/506 |
| 6,596,569 | B1 * | 7/2003 | Bao et al. | ........................ 438/151 |
| 2010/0259296 | A1 * | 10/2010 | Or-Bach | ........................... 326/38 |

FOREIGN PATENT DOCUMENTS

| CH | WO 2008/098404 A2 * | 8/2008 |
| WO | 2008/098404 | 8/2008 |

OTHER PUBLICATIONS

Chen Wayne et al, "Double-flip transfer of indium phosphide layers via adhesive wafer bonding and ion-cutting process," Applied Physics Letters, AIP, American Institute of Physics, Melville, NY, vol. 90, No. 5, Feb. 2, 2007.*

*Primary Examiner* — Yuanda Zhang
*Assistant Examiner* — Sheikh Maruf
(74) *Attorney, Agent, or Firm* — Occhiuti & Rohlicek LLP

(57) ABSTRACT

A method for transferring a thin layer of monocrystalline silicon from a free face of a monocrystalline silicon donor substrate having a thickness greater than that of the thin layer includes implanting ions through the free face to form a buried brittle layer in the silicon, using a polymer layer, bonding the donor substrate, by the free face, to a receiver substrate, and fracturing the thin layer from the donor substrate at the buried brittle layer by thermal fracture processing, and selecting conditions of implantation such that a thickness of the thin layer is smaller than 10 micrometers, and a thickness of the polymer layer is below a critical threshold defined as a function of energy and dose of the implantation, the critical threshold being less than or equal to the lesser of 500 nanometers and the thin layer's thickness.

12 Claims, 1 Drawing Sheet

METHOD FOR TRANSFERRING A THIN LAYER OF MONOCRYSTALLINE SILICON

CROSS-REFERENCE TO RELATED APPLICATIONS

Figure 1:
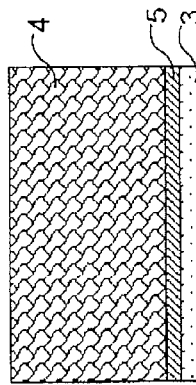

This application is the National Stage of International Application No. PCT/EP2011/060380, filed on Jun. 21, 2011, which claims the benefit of the priority date of French Application No. 1054969, filed on Jun. 22, 2010. The content of these applications is hereby incorporated by reference in its entirety.

TECHNICAL FIELD

Field of Disclosure

The invention pertains to a method for transferring a thin layer of monocrystalline silicon (with a thickness preferably less than 10 micrometers or even less than about one micrometer), on to a polymer layer. It can be applied especially to the making of an SOI (silicon-on-insulator) type of structure comprising a polymer as the insulating layer. It is also aimed at the transfer of a thin layer of monocrystalline silicon to a polymer-based substrate.

Background

The document FR-2 681 472 (Bruel) describes the basic principles of a method known as the "Smart Cut™" method. It describes especially a method for obtaining a thin layer of monocrystalline silicon on a support to give an SOI (silicon-on-insulator) type substrate. The standard method used comprises three successive steps. The first step is a step of implantation by ion bombardment, with hydrogen or helium for example, creating a buried embrittled zone in the volume of the implanted substrate (sometimes called a donor substrate), this buried embrittled zone delimiting a thin layer of the implanted material from the implantation face of the substrate. The second step consists in placing the implanted face into intimate contact with a receiver substrate. The third step consists in achieving a separation (or fracture) of the obtained structure at the buried embrittled zone by applying a thermal processing which brings about the coalescence of the defects generated by the implanted ions.

The receiver substrate has two functions in practice. First of all, it serves as a stiffener for the thin layer during its separation so as to prevent the formation of blisters caused by the coalescence of the defects and promote the development of cavities in the buried embrittled zone, along a plane parallel to the implantation surface and thus lead to separation. To this end, the substrate comprises, at least on the surface, a layer of a rigidity sufficient to ensure this stiffening role. In addition, it serves as a handling substrate enabling subsequent steps to be applied to the thin layer after its separation, especially when the thin layer is intended to be fixedly joined to another substrate for use. In practice, it has been seen that it could be unnecessary to add on a supplementary stiffener for thin-layer thicknesses above a threshold for which the thin layer is sufficiently rigid in itself to fulfill this stiffener role on its own. In this case, the receiver substrate can be omitted or it can be joined solely for purposes of a handling substrate.

For the joining of the implanted substrate to the receiver substrate by its implanted face, two techniques can be distinguished, namely direct bonding and polymer bonding (also called bonding by addition of material or adhesive bonding). Direct bonding, also called molecular bonding, dictates great planeity and low roughness of the two surfaces to be bonded, while polymer bonding lowers these constraints of planeity and roughness since the adhesive layer can compensate for a certain divergence of planeity or a certain level of roughness on each of the surfaces to be bonded.

Since, by application of the above-mentioned technology, the thin layer that is taken from the donor substrate is finally carried by the receiver substrate, the classic description speaks in terms of an operation for transferring the thin layer to the receiver substrate (whether or not it is the final substrate).

Among the main advantages provided by the use of a polymer as an adhesive layer, we may cite the following:
 the simplifying of the surface processing operations to be performed during bonding steps if any,
 the low cost of the bonding step,
 strong adhesion as soon as low temperatures are attained,
 high dismounting capacity (i.e. detaching capacity) by specific processing of the polymer.

It can furthermore be understood that the greater the thickness of the polymer within the receiver substrate, the higher is the mechanical flexibility of this mechanical substrate. In practice, the adhesive-forming polymer layer, of itself, provides mechanical adaptability between the underlying part of the receiver substrate and the thin layer, which may especially contribute to compensating for the constraints resulting, for example, from possible differences of thermal expansion coefficient between this underlying part and the thin layer.

Various materials have already undergone operations of transfer by application of the "Smart Cut™" method with implementation of a polymer layer.

Thus, the following document by Poberaj et al "Ion-sliced lithium niobate thin films for active photonic devices" in Optical Materials 30 (2009) 1054-1058 (see also WO 2008/098404) describes, in the field of optics, the transfer of thin layers of lithium niobate to a lithium niobate substrate after polymer bonding of the donor and receiver substrates through a layer of adhesive made of benzocyclobutene (BCB). It is stated that it is important for the receiver substrate to have a thermal expansion coefficient identical or similar to that of the transferred film. It has also been explained that this bonding, using a thin layer of adhesive polymer, has the advantage of presenting fewer constraints of planeity, roughness and the cleanliness of the surfaces to be bonded. In the example described, a structure is thus obtained formed by a receiver substrate of lithium niobate covered with a electrode-forming fine layer of chrome (50 nm thick), a BCB layer with a thickness of 1 to 2.5 micrometers and a thin layer of lithium niobate with a thickness of 670 nm.

Besides, the article by Chen et al, "Double-flip transfer of indium phosphide layers via adhesive wafer bonding and ion-cutting process", in Applied Physics Letters 90, 052114 (2007) describes the transfer of InP layers to a glass substrate after bonding by means of an adhesive layer formed by the Microchem SU-8 5 resin which is reticulated by UV radiation after the substrates are brought together. In the example described, we thus obtain a structure formed by a glass substrate surmounted by a resin layer (2.6 micrometers thick) and a thin InP layer (500 nm thick).

We may also cite the article by Ho et al, "Flexible Ge-on-polyimide detectors", in Applied Physics Letters 94, 261107 (2009) which describes the transfer of germanium (Ge) to polyimide after a bonding by means of an adhesive layer. It may be recalled here that one of the best known polyimides, in the form of dry film, is Kapton®. In the example described, a structure is thus obtained, provisionally, comprising a polyimide substrate, hence a flexible substrate, covered with a layer of photosensitive resin SU-8 2100 carrying a thin layer of germanium (1.6 micrometers thick).

It is worth nothing that the above-mentioned publications pertain to various materials which are all different from silicon. Now, it appears that the transfer of thin layers of silicon after bonding by polymer raises special difficulties which are still unexplained.

Thus, the article by Holl et al, "Fabrication Techniques for Thin-Film Silicon Layer Transfer", in ECS Transactions—Vol. 3, Issue 6 (2006), pp 67-73, comments on the transfer of thin layers of silicon after direct bonding and after bonding by means of a polymer layer. Various types of receiver substrates capable of serving as stiffeners are mentioned, namely molten silica, quartz and silicon. In the results pertaining to the transfer as such, it is indicated that, after a hydrogen implantation at a depth of 360 nm, a layer of three to four micrometers of $SiO_2$ (here below referred as $SiO_2$-TEOS) is deposited as a stiffener by vapor phase deposition (VPD) from TEOS (tetraethyl orthosilicate) on the silicon donor substrate. It is between this stiffener-forming oxide layer and the receiver substrate that the polymer layer is planned. It is stated that, when the thin layer of silicon is not stiffened by the oxide layer, the film does not keep its integrity during the separation. This document adds that it was possible, in trials, to form thin layers by separation after implantation, in using a high-temperature polymer as an adhesive. However, the document thus referred, namely the article by Collinge et al, "Silicon Layer Transfer Using Wafer Bonding and Debonding" in the Journal of Electronic Materials, Vol. 30, No 7, 2001, pp 841-844, and the document WO-2004/0102020 (Roberds et al), confirms the necessity of a thick layer of $SiO_2$ TEOS along the thin layer to be transferred in explaining that the polymer is far too flexible and that it can creep during the separation step giving rise to the formation of blisters. This 2001 article mentions thicknesses of 400 to 750 nm for the polymer layer in combination with thicknesses of one to four micrometers for $SiO_2$ TEOS and a silicon thickness of 360 nm.

In a different context, the document FR-2 925 221 (Di Cioccio) explains for example that a dual transfer (from a donor substrate to a receiver substrate and then to a final substrate) cannot be done by using flexible substrates because either they are too soft and get deformed during the step of maturation of the cavities at the buried brittle zone created by the implantation or they are heat-deformable or heat-degradable and do not withstand the temperatures imposed by the fracture method and, therefore, no longer retain the necessary rigidity. This document teaches (direct) bonding between one face of a donor substrate and one face of a silicone-type polymer after processing under UV radiation has been applied to this face, the effect of which is to convert the polymer layer into a rigid oxide on a great thickness of the order of 10 to 20 micrometers.

The transfer of a thin film, especially silicon, directly on to a polymer substrate (more specifically a flexible "Kapton®" support with a thickness of the order of 100 micrometers) is mentioned in the document FR-2 748 851, but in a version of the "Smart Cut™" technology where the fracture at the level of the implanted layer is obtained by application of additional mechanical force or forces from outside. There is no additional layer as a complement to this polymer substrate but it must be noted that since the fracture, according to this technology, implies thermal processing far smaller than in the case of a fracture of exclusively thermal origin, the blistering phenomenon is far smaller so that the presence of a stiffener is not necessary.

It can be concluded, in summarizing the above documents, that although a fracture within an implanted donor substrate can be obtained by an essentially thermal processing when the donor substrate is made of germanium, lithium niobate or indium phosphide and is bonded by means of a polymer layer to a receiver substrate, this is not so for a donor substrate made of silicon for which the presence of an intermediate layer acting as a stiffener along the future thin layer appears to be imperative.

It can be understood that the blistering phenomenon, which gives rise to the fragmentation of the thin silicon layer when there is no stiffener along this layer, is all the greater as the thickness of this thin layer is small. Now, the present trend is towards the use of increasingly fine layers of silicon, the thickness of which is now usually smaller than 10 micrometers or even smaller than 5 micrometers or even smaller than one micrometer or even smaller than 500 nm.

It would therefore seem to be presently impossible to achieve the transfer, by fracture along an implanted layer, of a thin layer of monocrystalline silicon less than 10 micrometers thick through an essentially thermal fracture processing when seeking the advantages of having a polymer layer adjacent to the face of this thin layer through which the implantation was done. However, the need is great, especially for photovoltaic applications requiring low-cost methods (which do not enable direct bonding to be carried out).

PRESENTATION OF THE INVENTION

The invention seeks to overcome the apparent impossibility set forth here above and proposes a method of fracture by implantation and by essentially thermal processing of a thin layer with a thickness of less than 10 micrometers (or even 5 micrometers or even one micrometer) of monocrystalline silicon adhering directly to a polymer layer.

To this end, the invention proposes a method for transferring a thin layer of monocrystalline silicon from a donor substrate made of monocrystalline silicon on a thickness, from a free face, that is greater than the thickness of the thin layer to be transferred, according to which ions of a given species are implanted through this free face so as to form a buried brittle layer in the monocrystalline silicon, this donor substrate is bonded, by said free face, to a receiver substrate by means of a polymer layer and a fracture of the thin layer from the donor substrate is prompted at the buried brittle layer by an essentially thermal fracture processing, characterized in that the conditions of implantation are such that the thickness of the thin layer is smaller than 10 micrometers and the thickness of the polymer layer is below a threshold, at most equal to 500 nm and to the thickness of the future thin layer, defined as a function of the energy and dose of the implantation.

Thus, the method of the invention comprises three main steps, namely an ion implantation, a placing in contact on a polymer and a fracture, the thickness of the polymer layer being fine enough, given the conditions of implantation (energy, which determines the implantation depth and dose which determines the density of the cavities generated at the buried brittle layer), for the presence of a stiffener opposite the thin layer relatively to the polymer layer to provide an effect of stiffening this thin layer through this polymer layer.

It has appeared to be the case that, above all in conditions of implantation leading to a thin layer with a thickness of less than 10 micrometers or even less than 5 micrometers or even less than one micrometer, the threshold of thickness which must not be crossed is lower than the classic thickness of a bonding layer. Indeed, the above-mentioned documents pertaining to LiNbO3 or InP mention bonding layers more than one micrometer thick (typically two micrometers or even more which are the standard thicknesses, recommended by the manufacturer, for implementing the polymers used). In the above-mentioned case pertaining to germanium, it must be noted that there is no rigid support. As for the documents commented on here above referring to silicon, they mention polymer thicknesses of 400 to 750 nm in combination with a layer of several micrometers of oxide $SiO_2$ TEOS between the polymer and the thin film to be detached (as a complement to a layer of oxide on the surface of the polymer).

It is worth noting that, in practice, the adhesive bonding materials such as BCB are provided in a form such that their spreading on a surface to be bonded is done naturally on a thickness of over one micrometer. Generally, it is only by thinking in terms of diluting this material that this thickness can be easily reduced. However, those skilled in the art tended to think that bonding by adhesive is especially efficient as the adhesive was uniformly distributed (i.e. that it is present everywhere), this result being all the easier to obtain as the thickness of this adhesive is great.

It is therefore contrary to the natural tendency of those skilled in the art to think in terms of reducing the thickness of the bonding layer until it is lower than a threshold below 500 nm, and in principle lower than a threshold below the thickness of the thin layer to be detached.

Moreover, faced with the difficulty of obtaining a satisfactory stiffening with the polymers layers implemented, it has been noted that a natural tendency of those skilled in the art is to think that a better stiffening effect would be obtained by increasing the thickness of the polymer in question, possibly under conditions giving it improved rigidity. However, this natural tendency too is contrary to the approach taught by the invention.

The donor substrate may be constituted, beneath its face by which it is bonded by the polymer to the receiver substrate, by a material other than monocrystalline silicon, for example a thermal oxide or a native oxide. This surface layer may have the role especially of protecting the donor substrate during the implantation step. This layer should have a minimum thickness of some tens of nanometers only, which is quite clearly insufficient by itself to prompt a significant stiffening effect.

One way to correlate the conditions of implantation with the maximum threshold of thickness of the polymer layer is to correlate this threshold with the average dimension of the cavities generated by the implantation and the thermal processing just before the purely thermal fracture. It is thus that, advantageously, the maximum threshold for the thickness of the polymer layer is in a ratio of the order of 1:15 relatively to the average dimension, parallel to said free face, of the blisters that would be observed in the donor substrate, after implantation with said energy and said dose of implantation. Typically, for this thickness, it is possible to choose a value of the order of 20 times smaller than this average lateral dimension.

The implantation can be done with a large variety of ion species, especially (but not necessarily) gaseous species. The case of a hydrogen implantation is well mastered. It is thus that, advantageously, the implantation is done with hydrogen ions with an implantation energy of at most 70 keV. Similarly, advantageously, the implantation is done with hydrogen ions with a dose of $3.10^{16}/cm^2$ and $1.5.10^{17}$ $H^+/cm^2$.

A co-implantation of hydrogen (in the dosage range of $2.10^{16}$ $H^+/cm^2$ to $10^{17} H^+/cm^2$) and boron (in the dosage range of some $10^{14}/cm^2$ to $5.10^{15}/cm^2$) can be done in order to lower the fracturing temperature. A co-implantation of hydrogen and helium can also be envisaged with doses for each species ranging from $2.10^{16}/cm^2$ to $10^{17}/cm^2$ and preferably from 2 to $5.10^{16}/cm^2$.

Various types of polymer can be used, vitreous or rubber-like, thermohardening or thermoplastic etc. Advantageously, the layer of polymer is made of benzocyclobutene or BCB (or a BCB-based product such as divinylsiloxane-bis-benzocyclobutene, or DVS-bis-BCB).

The method of the invention is compatible with temperatures of fracture that can be high when compared with the range of temperatures of the polymers. It is thus that the thermal fracture processing can be done for example at a temperature of at least 275° C., or even 320° C. or even 350° C.

The receiver substrate can be any unspecified substrate. However, advantageously, it can itself be polymer based. It is thus that, advantageously, the receiver substrate comprises a stiffener-forming layer carried by a polymer substrate. The stiffener-forming layer is advantageously formed by a silicon oxide or nitride on a thickness typically ranging from 2 to 10 micrometers. This polymer substrate can be a material different from that of the polymer layer. This material is advantageously polyimide, for example "Kapton®".

DETAILED DESCRIPTION OF EXAMPLES OF IMPLEMENTATION

Figure 2:
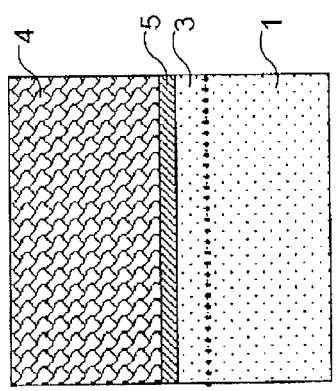
Figure 4:
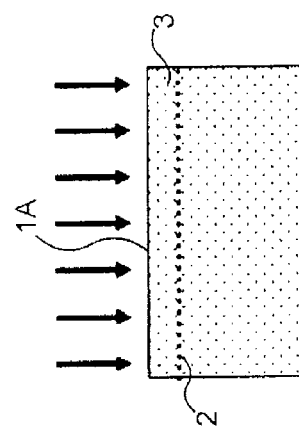
Figure 3:
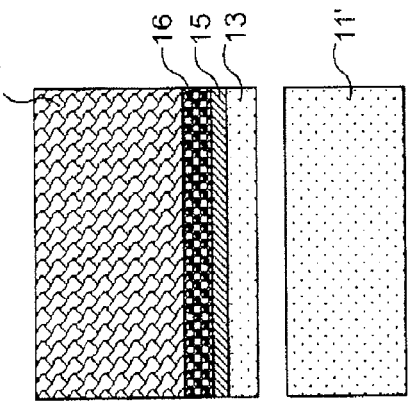
Figure 5:
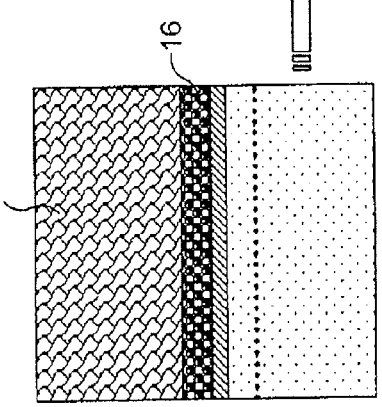
Figure 6:
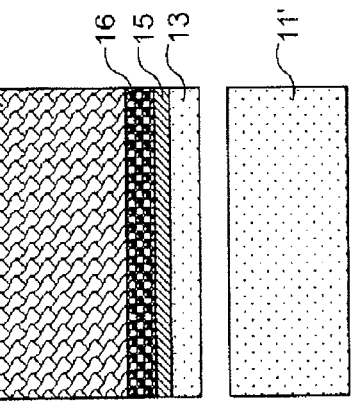

Objects, features and advantages of the invention shall appear from the following description, given by way of a non-exhaustive illustratory example with reference to the appended drawings of which:

FIG. 1 is a schematic drawing of a donor substrate in the course of implantation, FIG. 2 is a schematic drawing of this substrate after bonding by polymer to a receiver substrate, FIG. 3 is a schematic drawing of this substrate after transfer of a thin layer by thermal fracture, FIG. 4 is a drawing similar to that of FIG. 1, FIG. 5 is a drawing similar to that of FIG. 2, the receiver substrate being polymer based, and FIG. 6 is a schematic drawing representing the thin layer obtained, transferred to the polymer-based receiver substrate.

As can be seen in FIGS. 1 to 3, the method of the invention comprises chiefly three steps.

The first step (see FIG. 1) consists in implanting ions of a given species, preferably a gaseous species such as hydrogen or helium, in an initial substrate 1 of monocrystalline silicon, called a donor substrate, from which the thin layer will be taken. This donor substrate is herein a bulk substrate. As a variant, it is made of monocrystalline silicon only on a given thickness from the implantation face that is greater than the depth of implantation. In another variant, this substrate may comprise a very fine surface layer made of a material other than silicon on the surface, for example an oxide of 2 to 100 nanometers.

As a result of this implantation, an embrittled zone 2 is created in the volume delimiting a thin layer 3 of implanted material relatively to the implantation face of the substrate 1A.

The conditions of implantation are advantageously such that the depth of implantation which determines the thickness of the future thin layer is smaller than 10 micrometers or even smaller than one micrometer or even 750 nm or even 500 nm.

The second step (see FIG. 2) consists in joining the implanted substrate and a substrate 4 of any unspecified nature, called a receiver, by means of a polymer layer 5 of a certain thickness interposed between the two substrates. The stack constituted by the thin layer to be taken, the polymer 5, and the substrate 4 must have a stiffener role, i.e. it must promote the development, in a plane parallel to the implantation face, of the cavities generated by the implantation and thus enable an efficient transfer of the thin layer on the substrate. The transfer of the thin layer is considered to be efficient if at least 50% and preferably at least 80% or 98% of the surface of the thin layer is transferred to the substrate 4. To fulfill this stiffening function, the substrate 4 must comprise a hard material, at least on the surface, directly in contact with the polymer 5. A material is considered to be hard if its Young's modulus is greater than 10 GPa and preferably greater than 50 GPa or 100 GPa at 25° C. The substrate 4 can for example be a bulk substrate of this hard material or a stack of layers of different hard materials. In the case of a bulk substrate, it will have a thickness at least greater than 10 µm and preferably greater than 20 µm, 30 µm, 50 µm, 100 µm or 200 µm. The material is for example silicon.

It may also be a stack of one or more layers of hard materials (identical or different) and one or more layers of polymers (identical or different), a layer of a hard material being directly in contact with the polymer 5, this entire stack being rigid enough to obtain an efficient transfer.

In this embodiment, the substrate 4 is obtained by a bulk layer.

It is furthermore characterized in that:
the thickness of the polymer layer is smaller than a critical thickness which is smaller than 500 nm,
the layer to be separated (possibly covered with a fine oxide layer of a few nanometers) is in direct contact with the polymer layer.

The third step (see FIG. 3) consists in making a fracture of the structure obtained at the embrittled zone in applying an essentially thermal processing. Thus, a thin layer 3 fixedly joined to the substrate 4 and a remainder of the donor substrate referenced 1' are obtained.

In fact, it has been observed that this fracture has the specific feature by which the polymer is partially or totally subjected to an odometer-type compression (this term is taken in the sense in which it is discussed in the article by Gacoin el al, "Measurement of the mechanical properties of thin films mechanically confined within contacts", (2006)).

One aspect of the invention lies in the detection of the fact that there exists a critical thickness of the polymer layer situated between a donor substrate and a receiver substrate, this layer being in direct contact with the donor substrate:
if the thickness of the polymer layer is greater than a certain critical thickness of the polymer, it is not possible to carry out a quality transfer (blistering phenomena are observed),
if the thickness of the polymer layer is lower than a certain critical thickness of the polymer, this transfer is possible.

The maximum threshold for the thickness of the polymer layer can be determined empirically, on the basis of various parameters of the processing operations applied to the donor substrate between the implantation and the fracture.

It has been observed that, for thin layers of silicon with a thickness at most equal to 10 micrometers (all the more so in the case of a thickness less than one micrometer), the threshold is in practice smaller than 500 nm and often smaller than 400 nm or 300 nm. In addition, it is generally smaller than the thickness of the thin layer to be transferred.

One way of determining this threshold may consist in basing the operation on the characterization of the defects that get formed in the buried embrittled layer.

It is recalled here that when a wafer is implanted with a view to subsequent separation of a thin layer, blisters (bubbles) can be caused during the thermal processing of these implanted wafers. These blisters can develop in thickness if there is no stiffener perpendicular to the implanted zone. These blisters have lateral dimensions (in a plane parallel to the implantation face) that is greater than their third dimension (thickness perpendicular to this plane) for example by one or two orders of magnitude. For example, the lateral dimension of a blister is the diameter of the circle that minimizes the errors, according to the least squares method, between the perimeters of this circle and the orthogonal projection of the blister in a same plane parallel to the implantation face.

The dimensions of these blisters vary according to the implantation parameters, chiefly the energy (which determines the implantation depth) and the dose (which determines the size and the density of the faults generated); in fact these dimensions also vary as a function of the species implanted.

One approximation of the maximum threshold for the thickness of the polymer layer consists in stating that the ratio of the critical thickness of polymer to the average lateral size of these blisters is 1:15 (i.e. a thickness will be chosen for the polymer layer at least 15 times smaller than the lateral dimension of the blisters created by implantation). For example, this ratio is of the order of 1:20. A ratio of this kind has been seen to give an accurate representation of the results obtained for several combinations of parameters of implantation.

The approach to be followed to determine the borderline (critical) polymer thicknesses that cannot be exceeded in obtain a thermal transfer without blistering for thin layers of a thickness below 10 micrometers (especially in the range of one micrometer) is described here below:
Implanted silicon wafers are used, without stiffeners added to their surface.
The same conditions of implantation (the nature of the species, single or multiple implantations, energy and doses of ion implantation) and the same thermal processing operations (temperature, RTP, ramping, etc.) are used as those during the transfer of the thin layer 3 but without the substrate 4.

From the measurement of the lateral dimensions of the blisters thus obtained, the critical thickness of the polymer is determined by applying a ratio of the order of 1:20 to the average lateral size of blisters (the borderline thickness of a layer of polymer is thus about 20 times smaller than the average lateral dimension of the blisters in the embrittled zone formed by implantation). The average lateral size of the blisters is the average of the cross dimensions measured for the blisters.

The above-mentioned method can be implemented according to a wide variety of modalities.

The term "polymer layer" is understood to refer to any type of polymer:
whether liquid or solid, vitreous, crystalline or rubber-like during the different steps of the method;
whether it is shaped (drying, polymerization, reticulation) before, during or after the method,
whether it takes a liquid, viscoelastic or solid form.

The step for joining the implanted donor substrate, the polymer layer and the receiver substrate used as a support does not have to be carried out in a precise order. It is thus possible to:
fixedly join the implanted substrate, the polymer layer and the receiver substrate in a single step;
fixedly join first the implanted substrate and the polymer layer and then this unit to the receiver substrate, fixedly join the receiver substrate and the polymer layer and then join this unit to the implanted substrate;

fixedly join the implanted substrate and a polymer layer and then the receiver substrate and another polymer layer (possibly of a different nature) and then join the facing polymer layers.

The polymer layer can take the form of a composite layer comprising a stack of different polymers.

It can be understood that the concept of borderline thickness of the polymer is of interest here only inasmuch as the implantation depths added to the thicknesses of additional stiffeners are smaller than the thicknesses that suffice for making a self-supported film (a film is said to be self-supported when it can be separated without the addition of a stiffener). For a silicon film, this threshold is attained for a thickness of the order of 15 to 20 micrometers.

Trials were carried out to illustrate the feasibility of the method presented.

Different polymer thicknesses of DVS-his-BCB (i.e. divinylsiloxane bis benzocyclobutene, abbreviated as BCB) were applied to monocrystalline silicon substrates. It appeared that, for small polymer thicknesses, the transfer of silicon on to polymer was effectively achievable. However, for polymer thicknesses greater than the critical thickness, the greater the thickness of polymer, the smaller was the surface percentage of the transferred zones. The notion of borderline thickness of polymer was thus clearly identified.

In a first example, silicon wafers were implanted with hydrogen (27 KeV, $4\cdot10^{16}$ $H^+$ $cm^{-2}$) and boron (80 KeV, $10^{15}$ $cm^{-2}$). Other conditions of implantation could have been chosen, for example an implantation of hydrogen alone (27 KeV, $8\cdot10^{16}$ $H^+$ $cm^{-2}$). Layers of BCB with different thicknesses were deposited on the wafers thus implanted. The thicknesses of these layers are given in the following table.

| Implantation depth (nm) | Average lateral dimensions of the blisters (μm) | Thickness of polymer (nm) | Transfer |
|---|---|---|---|
| 350 | 5 to 6 | 60 | yes |
| 350 | 5 to 6 | 200 | yes |
| 350 | 5 to 6 | 500 | <20% |
| 350 | 5 to 6 | 1000 | <5% |

Experimental Results

The BCB films were dried (by evaporation of the solvent) for five minutes at 150° C. The wafers thus coated were then put into contact with second wafers, in the example also made of silicon. This putting into contact was done by means of the layer of polymer. This bonding was assisted by thermocompression to ensure that the wafers were efficiently put into contact. In the example considered, this step served as a thermal fracture processing step, in this case at a temperature of 300° C. for a two-hour processing. Depending on the thickness of polymer, a fracture was observed either throughout the surface or on one part only or there was no fracture. The examination of the results of the above table shows that an efficient fracture took place for a thickness at most equal to 300 nm, which corresponds to about 1/20 of the average lateral dimension of the blisters.

This average lateral dimension had been measured by observation by optical microscopy of an implanted wafer having bubbled, the bubbling having been obtained by thermal processing for two hours at 300° C. This test must advantageously be carried out at the temperature at which the fracture will be obtained. Besides, for this test, a thermal processing time is recommended that is appreciably equal to (or even slightly greater by a few percent than) the time needed to obtain the fracture in the presence of a stiffener in order to ensure that the bubbles have reached their maximum size.

According to a second example which is a variant of the first example, the polymer was spread not on the implanted wafer but on the second wafer (receiver) and then put into contact with the first wafer (donor). The fact of depositing the polymer layer on one or other of the wafers did not lead to different results.

Comparable results were obtained in the third and fourth examples, which are variants of the first two examples, in which the second wafer (receiver) was a glass wafer (for example of the "Borofloat®" 33 type by Schott).

In a fifth example, silicon wafers were implanted, also with hydrogen and boron but with different conditions: for hydrogen 70 KeV, $5.10^{16}$ $H^+$ $cm^{-2}$ and for boron 250 KeV, $1.2.10^{15}$ $cm^{-2}$. BCB layers of different thicknesses were deposited on these implanted wafers. It can be noted that these conditions of implantation corresponded to greater energy than in the above examples with a slightly higher dose.

| Implantation depth (nm) | Average lateral dimensions of the blisters (μm) | Thickness of polymer (nm) | Transfer |
|---|---|---|---|
| 670 | 7 to 9 | 200 | yes |
| 670 | 7 to 9 | 500 | ≈50% |
| 670 | 7 to 9 | 1000 | <20% |

Experimental Results

The BCB films were dried (by evaporation of the solvent) for five minutes at 150° C. These implanted wafers were then put into contact through the respective polymer layer, with second wafers made of silicon. The bonding was assisted by thermocompression to ensure that the wafers were efficiently put into contact. In the examples considered, this step served as a step of thermal fracture processing at a temperature of 300° C. for processing for two hours. Depending on the thickness of the polymer, a fracture was observed either throughout the surface or on one part only, or there was no fracture. The critical thickness in this example was thus determined as being of the order of 400 nm to obtain a transfer of more than 98% of the thin layer, which is of the order of 1/20 of the lateral dimension of the blisters observed. The critical thickness is of the order of 500 nm to obtain a transfer of at least 50% of the thin layer.

It can be noted that, when the implantation energy is made to vary for example, the implantation depth is modified. Furthermore, all other parameters being constant, a modification is observed in the lateral dimension of the blisters. This results in a modification of the critical thickness of polymer. When the implantation dose is increased, the number of defects is increased, thus leading, as the case may be to an increase in the number of blisters or to an increase in the lateral dimension of the blisters.

It is to be noted that the fact that the fracture takes place during or after the thermal processing for consolidating the bonding has no effect on the results. Similarly, the choice of the temperature and the duration of the thermal fracture processing leads to results also compatible with the correlation proposed here between critical thickness of the bonding polymer layer and the size of the blisters, provided that the previous methodology for determining critical thickness is complied with.

It can also be noted that, for thin layers with a thickness of less than 10 micrometers (and even more so of the order of one micrometer), the critical thickness is below 500 nm or 400 nm or 300 nm and at most equal to the implantation depth.

It must be noted that, despite its low value, the thickness of the polymer layer is sufficient for this layer to constitute an efficient insulating layer. The method of the invention therefore gives an SOP (silicon-on-polymer) type structure which is similar to an SOI (silicon-on-insulator) structure except that the insulating layer is the layer of polymer and not a traditional silicon oxide type insulator.

FIGS. 4 to 6 describe another embodiment of the invention making it possible, unlike in the teachings of the prior art, to transfer a silicon film to a thick flexible support.

As here above, an initial wafer (donor substrate) 11 is implanted so as to generate a buried embrittled layer 12 (FIG. 4) delimiting, within this substrate, a thin layer 13 to be transferred.

On the surface of a (receiver) polymer substrate 14, a film 16 is generated with a thickness sufficient for the stack of layers thus obtained to fulfill the stiffener function. For example, for this purpose, the thickness of the polymer 14 is greater than 10 μm or 100 μm and the thickness of the film 16 ranges from 2 μm to 10 μm. The film 16 is made out of a hard material.

Then, a thin layer of bonding polymer 15 with a thickness finer than the critical thickness is spread on the free surface of the stiffener film and/or on the surface of a first (donor) wafer.

The implanted donor substrate 11 is joined (FIG. 5) to the polymer-based substrate 14 which is stiffened on its surface.

The fracture is made (FIG. 6) by thermal processing so that the thin layer 16 is transferred to the polymer-based substrate 14 in leaving a donor substrate remainder (denoted as 11') that can be reused for further transfer cycles.

One alternative may be to:
deposit the polymer film with a thickness smaller than the critical thickness on the donor substrate,
then prepare the stiffener on the previous polymer film,
make the adhesive bonding with the receiver polymer substrate,
and make the fracture.

The stiffener film is advantageously made out of a silicon-based compound, for example an oxide or a nitride (SiO2, SiOx, SiN, Si3N4, SiNx, etc). It is created by any appropriate technique known in microelectronics, for example a deposition technique (CVD, spraying, spin glass, etc) or by modification of polymer surface properties (plasma, UV, oxidation of Si—X bonds, etc).

For example, it is possible to make such a transfer of monocrystalline silicon film on to a polyimide flexible substrate, for example made of "Kapton®" (or PI, PDMS, PET, PAN, etc) with the introduction of a layer of SiO2 deposited by PECVD as a stiffener film.

To this end, the following procedure can be followed:
A silicon wafer is implanted with hydrogen (70 KeV, 5.1016 H+ cm-2).
200 nm of BCB is deposited by spin coating on the implanted face of the wafer of implanted silicon.
6 μm of SiO2 is deposited by PECVD at 150° C. on a "Kapton®" substrate made with a thickness of 125 μm.
The two parts thus made are joined by thermocompression in placing the surfaces on which the oxide and the BCB film have been deposited so that they face each other.

The fracture is done by thermal processing at 300° C. for two hours.

It can easily be understood that the polymer layer can be formed out of several sub-layers, the total thickness remaining at most equal to the critical threshold defined here above.

The correlation between this threshold and the size of the blisters is only one example of determining. Other approximations can be implemented.

The essentially thermal fracture can be done in a wide range of temperatures and times.

The measurement of the size of the blisters can also be done by atomic force microscopy or AFM, or by mechanical profilometry. It is also possible to use optical microscopy which is enough for blister sizes of the order of 10 μm to be measured with a resolution of 100 nm. Any other measuring method of sufficient resolution would be appropriate.

The invention claimed is:

1. A method for transferring a thin layer of monocrystalline silicon from a free face of a donor substrate that is made of monocrystalline silicon having a thickness that is greater than that of the thin layer to be transferred, the method comprising implanting ions of at least one given species through said free face so as to form a buried brittle layer in said monocrystalline silicon, using a polymer layer, bonding said donor substrate, by said free face, to a receiver substrate, and prompting a fracture of said thin layer off of said donor substrate at said buried brittle layer by thermal fracture processing, said method further comprising selecting conditions of implantation such that a thickness of said thin layer is smaller than 10 micrometers, and a thickness of said polymer layer is below a critical threshold defined as a function of energy and dose of said implantation, said critical threshold being less than or equal to the lesser of 500 nanometers and a thickness of said thin layer.

2. The method of claim 1, wherein said critical threshold is 15 times smaller than an average dimension, parallel to said free face, of blisters that are observed in an identical donor substrate after implantation thereof with said energy and said dose of implantation and after said thermal fracture processing in the absence of stiffener.

3. The method of claim 1, wherein implanting ions comprises implanting hydrogen ions with an implantation energy of at most 70 keV.

4. The method of claim 1, wherein implanting ions comprises implanting hydrogen ions with a dose between $2.10^{16}$ H+/cm$^2$ and $6.10^{16}$ H+/cm$^2$.

5. The method of claim 1, wherein bonding said donor substrate using said polymer layer comprises using a polymer layer made of benzocyclobutene.

6. The method of claim 1, wherein prompting a fracture of said thin layer from said donor substrate at said buried brittle layer by thermal fracture processing comprises carrying out said thermal fracture processing at a temperature of at least 300° C.

7. The method of claim 1, wherein bonding said donor substrate, by said free face, to a receiver substrate comprises providing a receiver substrate comprising a rigid film borne by a polymer substrate forming a stiffener.

8. The method of claim 7, wherein said rigid film is formed by a silicon oxide or nitride on a thickness between 2 micrometers and 10 micrometers.

9. The method of claim 7, wherein said polymer substrate is made of a material different from said of the polymer layer.

10. The method of claim 7, wherein said polymer substrate is made of polyimide.

11. The method according to claim 1, wherein said receiver substrate comprises a hard material, at least on a surface directly in contact with said polymer layer, to fulfill a stiffening function, said hard material having a Young's modulus greater than 10 GPa at 25° C.

12. The method according to claim 1, wherein implanting ions of at least one given species through said free face comprises implanting said ions through a very fine surface layer made of a material other than silicon on said free face.

* * * * *